Figure 1:
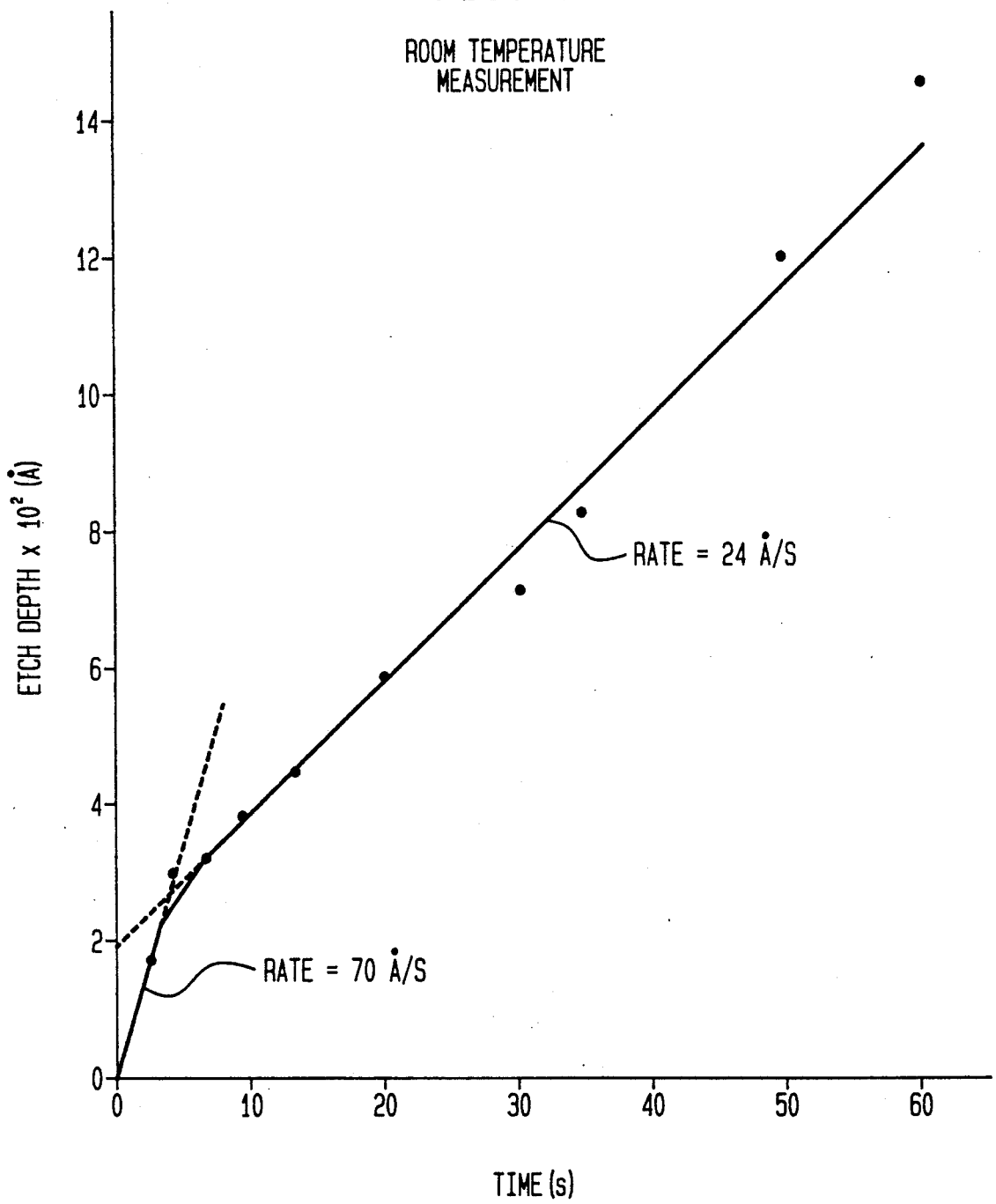

United States Patent [19]

Shokoohi

[11] Patent Number: 4,997,522

[45] Date of Patent: Mar. 5, 1991

[54] WET CHEMICAL ETCHANT AND METHOD FOR ETCHING HIGH TEMPERATURE SUPERCONDUCTIVE FILMS

[75] Inventor: Frough K. Shokoohi, Bedminster, N.J.

[73] Assignee: Bell Communications Research, Inc., Livingston, N.J.

[21] Appl. No.: 395,479

[22] Filed: Aug. 18, 1989

[51] Int. Cl.$^5$ .......................... B44C 1/22; C23F 1/02; C03C 15/00; C09K 13/00
[52] U.S. Cl. ................................. 156/659.1; 156/656; 156/667; 204/192.24; 252/79.1; 252/79.4; 427/62; 505/820
[58] Field of Search ............................ 252/79.1, 79.4; 156/654, 655, 656, 659.1, 663, 664, 666, 667; 204/192.24; 29/599; 427/62, 63; 505/728, 816, 817, 820

[56] References Cited

U.S. PATENT DOCUMENTS 4,554,050 11/1985 Minford et al. ...................... 156/664

OTHER PUBLICATIONS

Yoshizako et al., "Chemical Etching of High-Tc Superconducting Y-Ba-Cu-O Films in Phosphoric Acid Solution", Japanese Journal of Applied Physics, vol. 26, No. 9, Sep. 1987, pp. L1533-L1534.

"High-Resolution Patterning of High $T_c$ Superconductors", L. R. Harriott et al., Appl. Phys. Lett. 55 (5), pp. 495-497, Jul. 31, 1989.

"Nonaqueous Chemical Etch for $YBa_2Cu_3O_{7-x}$," R. P. Vasquez et al., Appl. Phys. Lett. 53 (26), pp. 2692-2694, Dec. 26, 1988.

"Focused Ion Beam Processes for High-$T_c$ Superconductors," S. Matsui et al., J. Vac. Sci. Technol. B6 (3), pp. 900-905, May/Jun. 1988.

Primary Examiner—William A. Powell
Attorney, Agent, or Firm—James W. Falk; Edward M. Fink

[57] ABSTRACT

A system for etching superconducting films of yttrium-barium-copper-oxide ($YBa_2Cu_3O_2$) is disclosed. The etchant comprises ethylenediaminetetraacetic acid of varying concentrations in water or a water/glycerol mixture. The described etchant permits superconducting transition temperatures to remain unaffected within the experimental accuracy of 1° C. Additionally, films do not require reoxygenation after etching, and the etchant is suitable for micropatterning using standard photolithography.

4 Claims, 3 Drawing Sheets

ROOM TEMPERATURE MEASUREMENT

WET CHEMICAL ETCHANT AND METHOD FOR ETCHING HIGH TEMPERATURE SUPERCONDUCTIVE FILMS

FIELD OF THE INVENTION

This invention relates to a novel chemical etchant. More particularly, the present invention relates to a wet chemical etchant for high temperature superconductive films comprising ethylenediaminetetraacetic acid in water.

During the past two years, considerable effort has been focused upon the preparation of high temperature superconducting ceramics and their thin films evidencing transition temperatures in excess of 90° K. In order to fully exploit the device applications of these materials, it is necessary to develop microfabrication techniques which are compatible with these materials. Heretofore, dry etching techniques such as reactive ion etching, ion beam etching as well as maskless focused ion beam lithography and laser ablation have been used for this purpose. Although these techniques have shown promise for producing micron-size patterns, oftimes they damage the materials, so resulting in the degradation of the transition temperature, $T_c$, and damage to the layers underlying the superconductive film.

Studies have revealed that wet chemical etching is an alternative to these prior art techniques and has resulted in the elimination of the foregoing difficulties. Typical etchants used for this purpose are aqueous solutions of phosphoric, nitric or hydrochloric acid. Unfortunately, these etchants typically remove material at a rate greater than 0.5 $\mu$m/minute for concentrations as low as 1:40 (acid:water) by volume, so rendering such solutions undesirable for thin film microfabrication. More recently solutions of bromine in ethanol and a derivative of phosphoric acid in methanol have been used for this purpose. However, their use for microfabrication by photolithography is limited by considerations dictated by the solubility of standard photoresist masks in organic solvents containing methyl groups.

In accordance with the present invention these prior art limitations have been effectively obviated by means of a novel etchant comprising an aqueous solution of ethylenediaminetetraacetic acid, a chelating agent which reacts with metal ions to form stable complexes. Studies have revealed that this novel etchant readily removes yttrium-barium-copper oxide while leaving substrate material intact, both the reagent and its reaction products being water soluble and compatible with standard photoresist lithography for microfabrication of superconducting devices. In use, the etchant has fabricated patterns ranging from 1-50 $\mu$m in width with no measurable degradation in the superconducting transition temperature.

Figure 2:
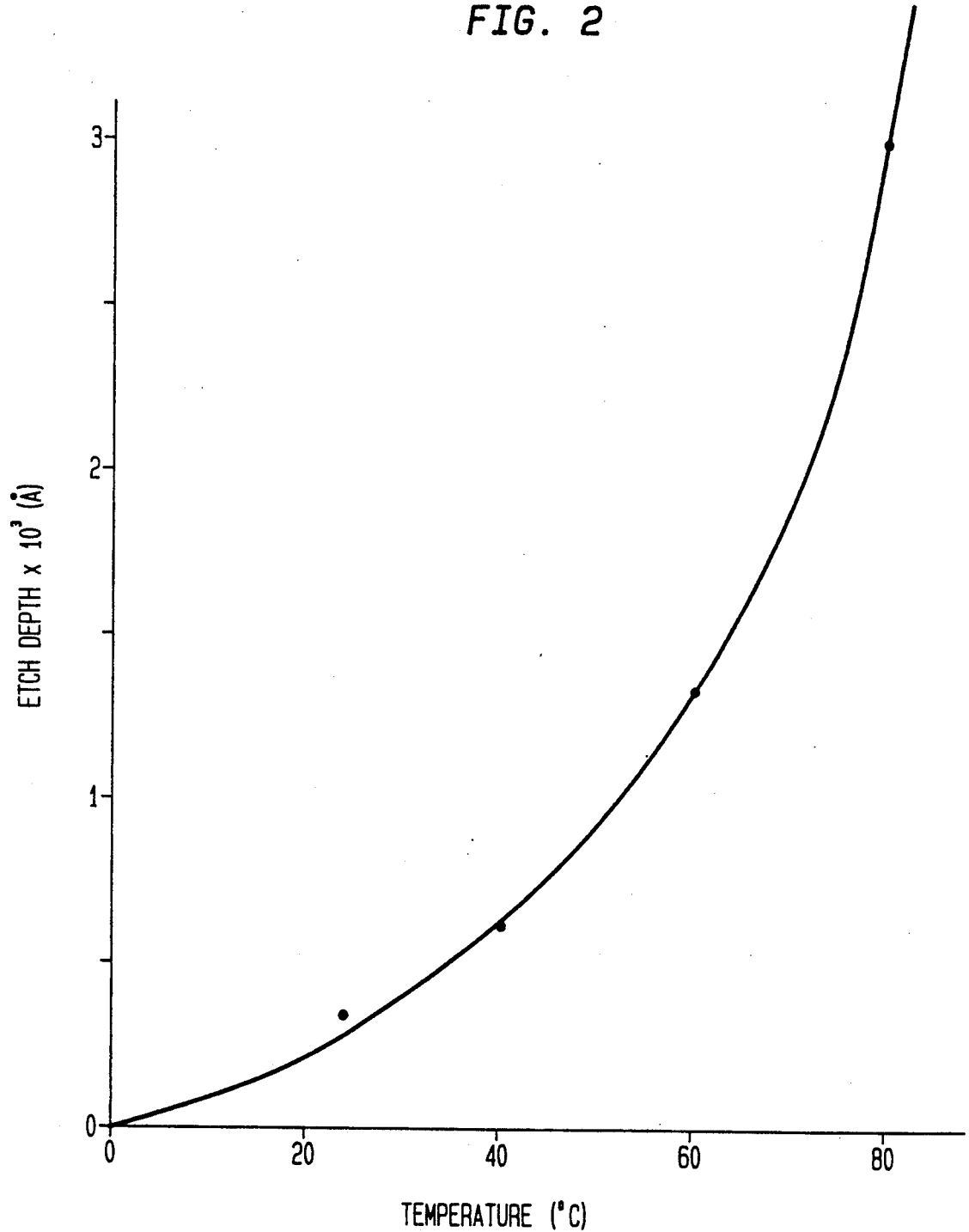
Figure 3:
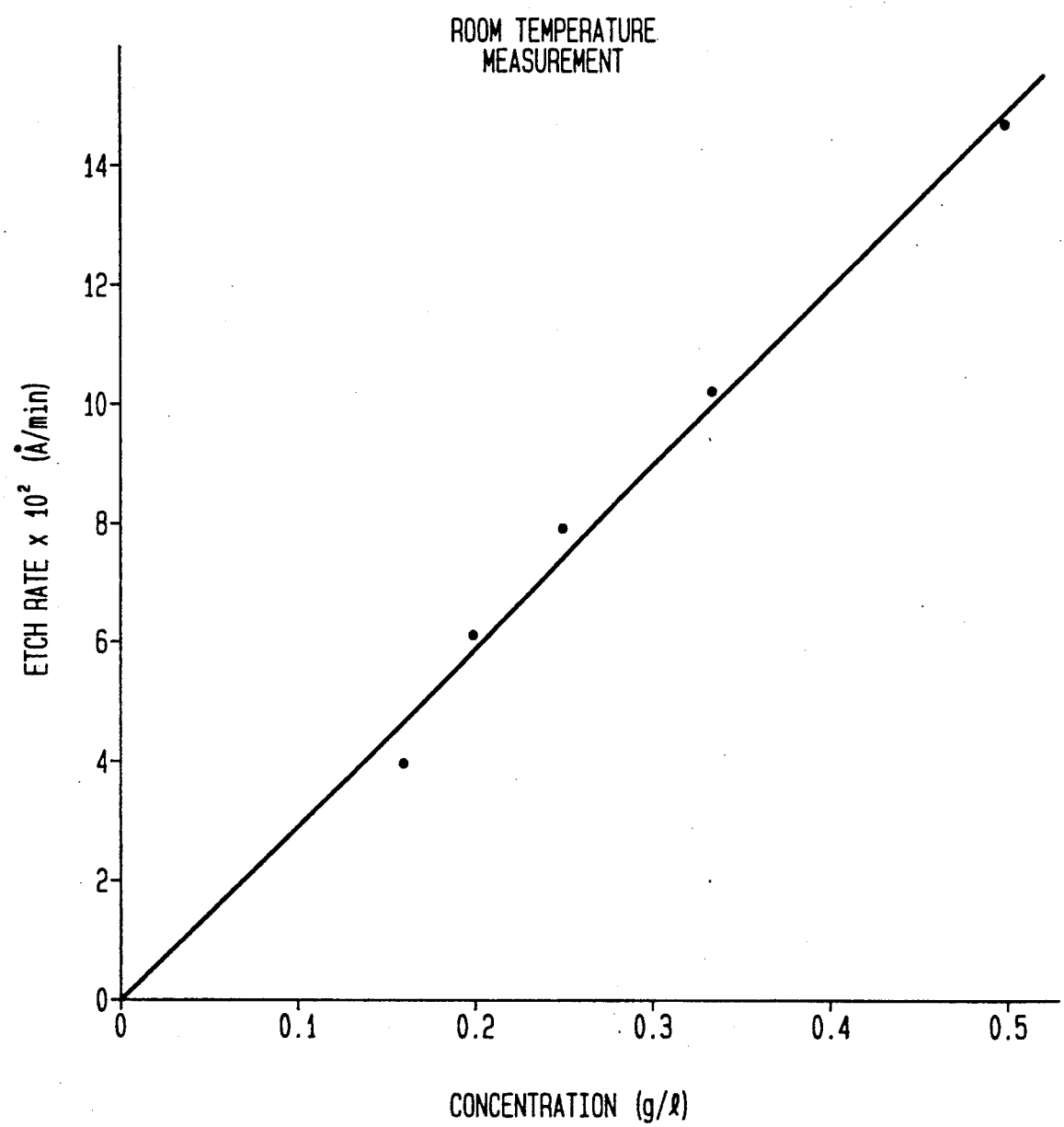

The invention will be more readily understood by reference to the following detailed description taken in conjunction with the accompanying drawing wherein:

FIG. 1 is a graphical representation on coordinates of time in seconds against etch depth in Angstroms showing variations in etch depth for a saturated aqueous solution of ethylenediaminetetraacetic acid as a function of time;

FIG. 2 is a graphical representation on coordinates of temperature of the etching solution in degrees centigrade against etch depth in Angstroms showing variations in etch depth as a function of temperature; and FIG. 3 is a graphical representation on coordinates of concentration in grams/liter against etch rate in Angstroms per minute showing the variation of etch rate as a function of the etchant concentration in solution.

As noted, the wet chemical etchant described herein comprises ethylenediaminetetracetic acid (EDTA) of the formula:

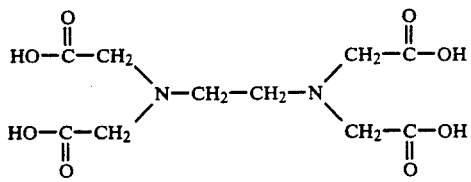

Ethylenediaminetetraacetic acid is a hexadentate chelating agent which reacts with metal ions to form stable complexes. The etchant, obtained from commercial sources, is employed in the form of an aqueous solution in which the concentration of EDTA in deionized water may range from 0.1-0.5 grams/liter at room temperature. The upper limit of 0.5 gram/liter corresponds with the maximum solubility of EDTA in water at room temperature, it being found that the presence of an excess of EDTA crystals eliminates concentration degradation with time during the etching process. In order to optimize anisotropic etching, it may be advantageous to make the etching process diffusion limited. This end may be attained by increasing solution viscosity, for example, by the addition of glycerol to the aqueous solution of EDTA. It has been found that the use of this expedient permits fabrication of superconducting wires of less than or equal to 1 micron in width. Other compositions which mix well with water and increase solution viscosity include ethyleneglycol, sugar of varying composition, and the like. The efficacy of the novel etchant was evaluated by monitoring the characteristics of the etchant in the procedure set forth in the following example.

EXAMPLE

The films selected for etching were superconducting yttrium-barium-copper oxide (YBa$_2$Cu$_3$O$_7$) having a thickness ranging from 0.1-0.5 $\mu$m which were deposited on a (001) strontium titanate magnesium oxide and sapphire substrate by pulsed excimer laser deposition at 750° C. Patterns were obtained using a positive photoresist, obtained commercially, which was spun at 5000 rpm for 30 seconds and a 15 minute post spin bake at 90° C. Then, a saturated solution of EDTA in pure water or EDTA in water and glycerol was used as an etchant for the areas devoid of photoresist, stirring of the etchant being effected during etching. The morphology of the etched patterns were studied by scanning electron microscopy (SEM) and the superconducting transitions of the film were monitored before and after patterns were etched with a four probe arrangement using pressed-on silver contacts.

With reference now to FIG. 1, there is shown a graphical representation on coordinates of time versus etch depth $\times 10^2$ Å showing variations of etch depth of the YBa$_2$Cu$_3$O$_7$ films as a function of time. Material removal is represented by the straight line where the slope of the line is the etch rate of the film. The data indicate an initial faster rate of etching of the porous and unstable surface layers of approximately 70 Å/second. As the surface layers are etched, the bulk of the film is exposed and the overall removal rate for the remaining bulk of the film is 24 Å/second. Studies revealed that exposure to this etchant does not degrade superconducting properties of the films. Thus, this chemical can be readily used for surface preparation and the removal of the porous surface layer and the nonsuperconducting phases which can be formed on the surface of the films during the high temperature annealing process. This is extremely useful in surface preparation where studies involve surface sensitive probes or low-resistance surface contacts needed for device applications.

Variations of the etch rate with changes in temperature are shown in FIG. 2. The Figure reveals that the etch rate at room temperature (24 Å/second in FIG. 1) is 0.14 μm/minute whereas at 50° C. material is removed by approximately a factor of two faster than at room temperature. Based upon the slope of the semilogarithmic plot of removal rate versus temperature, the activation energy for the overall reactive removal of Y-Ba-Cu-O films is approximately 0.18 eV. FIG. 3 is a graphical representation on coordinates of EDTA concentration in grams per liter against etch rate $\times 10^2$ angstrom/minute illustrating that at room temperature the etch rate varies linearly with concentration over the concentration range employed in the practice of the invention.

Usually, process-induced degradation of superconductivity and morphology are significant factors in wet etching. Accordingly, the superconducting transition of the films was measured before and after exposure to the etching solution. Before chemical treatment, the zero resistance temperatures of the films, were typically 90°–91° K. Following etching, it was determined that the zero resistance temperature was reduced by less than 1° K. which is within the accuracy of the measurements. The described etchant selectively etched the Y-Ba-Cu-O superconducting films and was found to be non-abrasive with respect to the substrate materials.

Although the invention has been described in terms of wet etching of superconducting films in the Y-Ba-Cu-O system, it will be understood by those skilled in the art that the described etchant may also be used with similar results in etching films in the bismuth, thallium and erbium superconducting systems as well as the yttrium-scandium systems. Accordingly, the foregoing exemplary embodiment is set forth solely for purposes of exposition and is not to be construed as limiting.

What is claimed is:

1. Method for wet chemical etching of high temperature superconducting films which comprises exposing said films to an aqueous solution of ethylenediaminetetraacetic acid having an ethylenediaminetetraacetic acid concentration of from 0.1 grams/liter to the maximum solubility of ethylenediaminetetraacetic acid in water at room temperature.

2. Method in accordance with claim 1 wherein the superconducting film comprises $YBa_2Cu_3O_7$.

3. Method in accordance with claim 1 wherein said etchant comprises ethylenediaminetetraacetic acid in a water/glycerol mixture.

4. Chemical etchant for high temperature superconductive films comprising an aqueous solution of ethylenediaminetetraacetic acid to which glycerol has been added, the concentration of ethylenediaminetetraacetic acid ranging from 0.1 grams/liter to the maximum solubility of ethylenediaminetetraacetic acid in water at room temperature.

* * * * *